US009842723B2

(12) United States Patent
Hirai et al.

(10) Patent No.: US 9,842,723 B2
(45) Date of Patent: Dec. 12, 2017

(54) DEFECT OBSERVATION SYSTEM AND DEFECT OBSERVATION METHOD

(71) Applicant: HITACHI HIGH-TECHNOLOGIES CORPORATION, Tokyo (JP)

(72) Inventors: Takehiro Hirai, Tokyo (JP); Masashi Sakamoto, Tokyo (JP); Hideki Nakayama, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 110 days.

(21) Appl. No.: 14/423,091

(22) PCT Filed: Jul. 1, 2013

(86) PCT No.: PCT/JP2013/067969
§ 371 (c)(1),
(2) Date: Feb. 20, 2015

(87) PCT Pub. No.: WO2014/034252
PCT Pub. Date: Mar. 6, 2014

(65) Prior Publication Data
US 2015/0214000 A1 Jul. 30, 2015

(30) Foreign Application Priority Data
Aug. 30, 2012 (JP) ................. 2012-189415

(51) Int. Cl.
*G06K 9/00* (2006.01)
*H01J 37/22* (2006.01)
(Continued)

(52) U.S. Cl.
CPC ........... *H01J 37/222* (2013.01); *G06T 7/001* (2013.01); *H01J 37/22* (2013.01); *H01J 37/28* (2013.01);
(Continued)

(58) Field of Classification Search
None
See application file for complete search history.

(56) References Cited

U.S. PATENT DOCUMENTS

| 5,412,209 | A | 5/1995 | Otaka et al. |
| 2006/0104500 | A1 | 5/2006 | Obara et al. |
| 2008/0310704 | A1* | 12/2008 | Tachibana ............ G01N 23/225 382/148 |

FOREIGN PATENT DOCUMENTS

| JP | 01-209647 A | 8/1989 |
| JP | 5-151927 A | 6/1993 |

(Continued)

OTHER PUBLICATIONS

International Search Report PCT/JP2013/067969 dated Aug. 13, 2013.

*Primary Examiner* — Fred Hu
(74) *Attorney, Agent, or Firm* — McDermott Will & Emery LLP

(57) ABSTRACT

When contamination or local electrification is generated during acquisition of a low-magnification image, if a high-magnification image contains both a portion in which the contamination or local electrification is generated and a portion in which the contamination or local electrification is not generated, a region whose image quality has changed due to the contamination or local electrification is erroneously recognized as a defect. Thus, defect detection fails or it may be impossible to correctly determine the feature quantity of a defect. The invention provides a defect observation system that acquires sample images at a low magnification and a high magnification, and sets the position or size of the field of view of the high-magnification image or the electron beam irradiation range during acquisition of the low-magnification image no that the image acquired at the (Continued)

high magnification does not contain the outer edge of the image acquired at the low magnification.

9 Claims, 13 Drawing Sheets

(51) Int. Cl.
    *H01J 37/28*     (2006.01)
    *G06T 7/00*     (2017.01)

(52) U.S. Cl.
    CPC ............ *G06T 2207/10061* (2013.01); *H01J 2237/221* (2013.01); *H01J 2237/2448* (2013.01); *H01J 2237/24592* (2013.01); *H01J 2237/2806* (2013.01); *H01J 2237/2817* (2013.01)

(56) References Cited

FOREIGN PATENT DOCUMENTS

| | | |
|---|---|---|
| JP | 2006-145269 A | 6/2006 |
| JP | 2010-244740 A | 10/2010 |
| JP | 2011-158256 A | 8/2011 |

\* cited by examiner

DEFECT OBSERVATION SYSTEM AND DEFECT OBSERVATION METHOD

CROSS-REFERENCE TO RELATED APPLICATIONS

This application is the U.S. National Phase of PCT/JP2013/067969 dated Jul. 1, 2013, which claims priority to Japanese Patent Application No. 2012-189415 filed Aug. 30, 2012. The subject matter of each is incorporated herein by reference in entirety.

TECHNICAL FIELD

The present invention relates to a defect observation system and a program used for the defect observation system.

BACKGROUND ART

In order to ensure a high yield in production of semiconductors, it is important to take measures by finding defects generated in the production process at an early stage.

A SEM (Scanning Electron Microscope) defect observation apparatus is an apparatus for observing a variety of such defects, and is typically an apparatus for observing an image of defect coordinates, which has been detected with a higher-level defect inspection apparatus, with higher image quality than that of the higher-level defect inspection apparatus. Specifically, a sample stage is moved to the defect coordinates output from the higher-level defect inspection apparatus, and then, an image is captured at a low magnification at about a level that allows the field of view to contain the target defect to be observed. Then, the defect coordinates are detected from the captured low-magnification image, and the sample stage is moved so that the defect is located at the center of the field of view or the center of image capturing is moved, and then, a high magnification image for observation is acquired at a high magnification that is suitable for observing the defect. As described above, defect coordinates are detected from a low-magnification image since defect coordinates output from a higher-level defect inspection apparatus contain errors within the range of the specifications of the apparatus. Thus, when a high-quality defect image is acquired with a SEM defect observation apparatus, a process of correcting such errors should be performed.

ADR (Automatic Defect Review or Redetection) is a technique of automating a step of acquiring such a high-quality defect image. In the ADR, it is necessary to optimize the conditions to acquire a low-magnification image for detecting a defect, the conditions to acquire a high-magnification image for analyzing the defect, and the like in accordance with the defect detection accuracy of the higher-level defect inspection apparatus, the properties of a sample, and the type of the defect to be observed in order to achieve both a high detection rate of the ADR and high throughput.

ADC (Automatic Defect Classification) is a technique of automating a step of classifying defects by type on the basis of a defect image acquired with high quality. As the ADR has been put into practical use and the applicable step of the ADR has increased, there have been cases where the operation of analyzing the automatically acquired defect image is a bottleneck, and the applicable step of the ADC is thus desired to be increased. In practice, the ADC has been put into practical use, and the applicable step of the ADC has increased, in particular, in the mass production line.

Patent Literature 1 discloses a technique of executing an autofocus process outside the field of view of a defect image so that contamination generated in the autofocus process will not adversely affect the defect image.

CITATION LIST

Patent Literature

Patent Literature 1: JP 2010-244740 A

SUMMARY OF INVENTION

Technical Problem

With the miniaturization of design patterns as well as the increased complexity of the production process in recent years, the types of defects that influence yields have also increased, resulting in an increased number of production steps that should be observed. Further, minute defects that have not been regarded as problems so far have now become the targets to be observed. In order to detect minute defects, it is necessary to increase the number of integrations of frame images to reduce noise. Thus, it is unavoidable to acquire an image under the observation conditions in which contamination or local electrification is likely to be generated. In particular, when contamination or local electrification is generated during acquisition of a low-magnification image, if a high-magnification image contains both a portion in which the contamination or local electrification is generated and a portion in which the contamination or local electrification is not generated, the ADR or ADC will erroneously recognize a region whose image quality has changed due to the contamination or local electrification as a defect. In such a case, defect detection fails or it may be impossible to correctly determine the feature quantity of a defect.

When the technique disclosed in Patent Literature 1 is used, it is possible to acquire a defect image without the influence of contamination that is generated during autofocus. However, in the ADR, it would be impossible to avoid the influence of contamination or local electrification that is generated during acquisition of a low-magnification image for use in detection of a defect.

An object of the present invention is to provide a defect observation system that can perform a process of detecting defects and classifying the defects with high accuracy even when there is a possibility that contamination or local electrification may be generated during acquisition of a low-magnification image.

Solution to Problem

In order to solve the above problem, the configurations recited in the claims are adopted, for example. Although the present application contains a plurality of means for solving the problem, one example thereof includes setting the field of view of a high-magnification image or a low-magnification image so that the field of view of the high-magnification image does not contain the outer edge portion of the field of view of the low-magnification image.

Advantageous Effects of Invention

According to the present invention, a defect observation system can be provided that can perform a process of detecting defects and classifying the defects with high accuracy even when there is a possibility that contamination or local electrification may be generated during acquisition of a low-magnification image.

Other problems, configurations, and advantageous effects will become apparent from the following description of embodiments.

DESCRIPTION OF EMBODIMENTS

Description will be made of an exemplary configuration of a SEM defect observation system with a function of acquiring a high-magnification image so that the high-magnification image does not contain the boundary of contamination or local electrification that is generated during acquisition of a low-magnification image. The defect observation system described below is merely an illustrative example of the present invention. Thus, the present invention is not limited to the following embodiments. A "defect observation system" in the present invention is an apparatus that captures an image of a sample using a charged particle beam, and includes a wide variety of apparatuses that capture images at a plurality of different magnifications.

As an exemplary configuration of the defect observation system, an example in which a defect image is acquired by a SEM defect observation apparatus using ADR will be described. However, the system configuration is not limited thereto, and the defect observation system may be partially or entirely constructed from different apparatuses. For example, the ADR process in this embodiment may be performed by a recipe management device that is connected to the SEM defect observation apparatus over a network, by an image management device, or by a program that executes a desired computation process with a CPU (Central Processing Unit) mounted on a general-purpose computer in the system. Further, an existing apparatus may be upgraded using a storage medium that has the program recorded thereon.

In this specification, the term "defect" includes not only a defect of a pattern but includes a wide range of observation targets, such as foreign matter, abnormal pattern dimensions, and defective structures.

Hereinafter, embodiments of the present invention will be described in detail with reference to the drawings.

A SEM observation apparatus is an apparatus that, upon receiving as input information defect coordinates, which have been detected with a defect inspection apparatus, such as an optical or SEM inspection apparatus, acquires a high-quality SEM image of the defect coordinates or observation coordinates under the conditions that are suitable for observation or analysis. As the input information for the SEM observation apparatus, it is possible to use coordinate information on the observation point extracted through simulation or the like on the basis of the design layout data.

Figure 1:
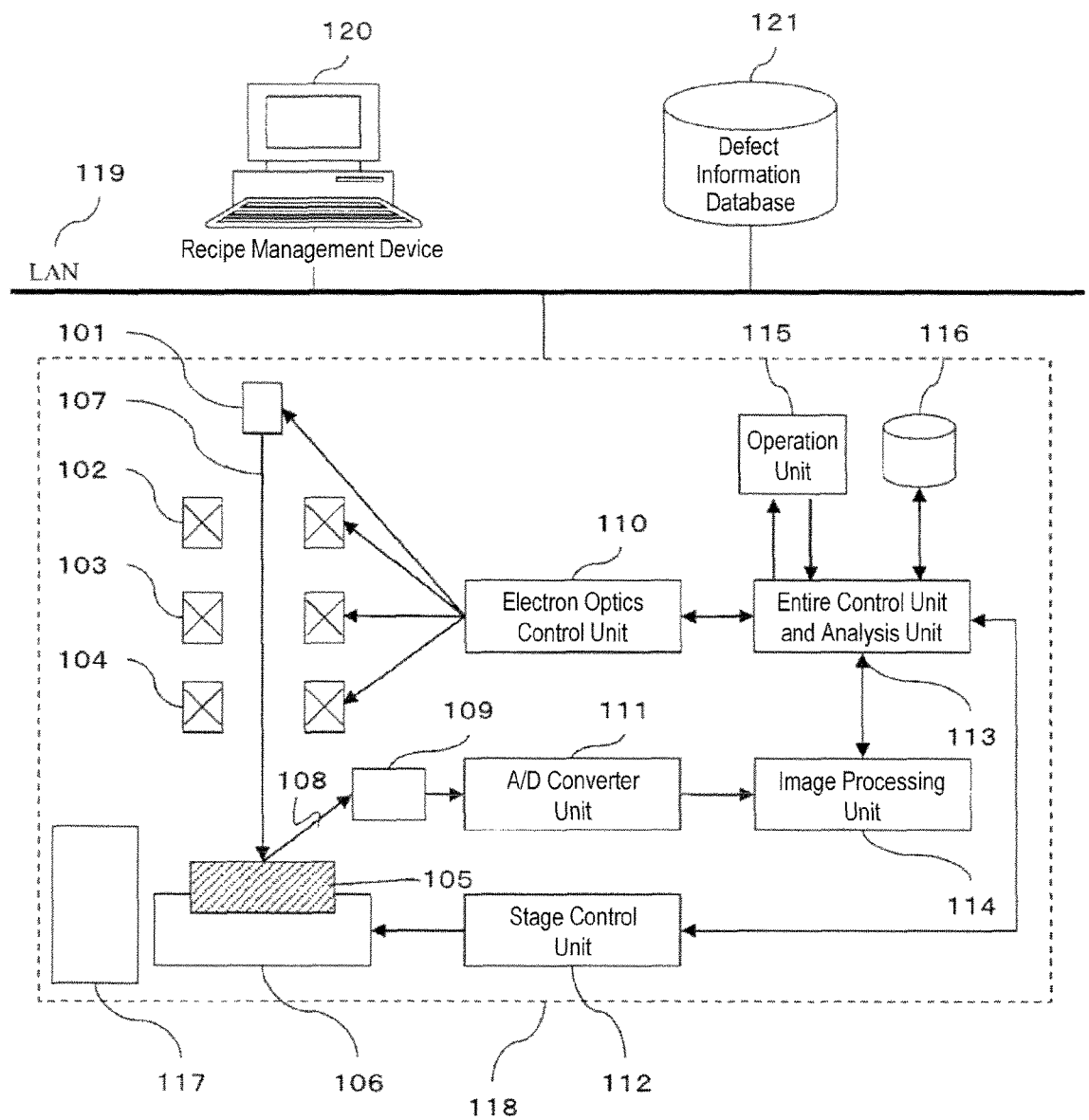
FIG. 1 is a schematic configuration diagram of a SEM defect observation system.

FIG. 1 is a schematic diagram showing the entire configuration of a SEM observation system in this embodiment. A SEM defect observation apparatus 118 in FIG. 1 includes electron optics, which include optical components such as an electron gun 101, a lens 102, a scanning deflector 103, an objective lens 104, a sample 105, and a secondary particle detector 109, a stage 106 for moving a sample table, which holds a target sample to be observed, on the XY plane, an electron optics control unit 110 that controls the variety of optical components included in the electron optics, an A/D converter unit 111 that quantizes an output signal of the secondary particle detector 109, a stage control unit 112 that controls the stage 106, an entire control/analysis unit 113, an image processing unit 114, an operation unit 115, which includes a display, a keyboard, a mouse, and the like, a storage device 116 that holds the acquired images or the like, an optical microscope 117, and the like. The electron optics, the electron optics control unit 110, the A/D converter unit 111, the stage 106, and the stage control unit 112 constitute a scanning electron microscope that is a means for capturing a SEM image.

A primary electron beam 107 emitted from the electron gun 101 is converged by the lens 102 and deflected by the scanning deflector 102, and is then converged by the objective lens 104 and irradiates the sample 105. Secondary particles 108, such as secondary electrons and reflected electrons, are generated from the sample 105 irradiated with the primary electron beam 107 in accordance with the shape or the material of the sample. The generated secondary particles 108 are detected by the secondary particle detector 109, and are then converted into a digital signal with the A/D converter unit 111. An output signal of the secondary particle detector converted into a digital signal may sometimes be referred to as an image signal. The output signal of the A/D converter unit 111 is output to the image processing unit 114 to form a SEM image. The image processing unit 114 uses the generated SEM image to execute a variety of image analysis processes, such as an ADR process for executing image processing like detection of defects and an ADC process for automatically classifying defects by type.

The SEM observation apparatus in this embodiment can acquire images of a target region to be observed at a plurality of different magnifications. For example, it is possible to observe the region by changing the magnification by changing the scanning range of the scanning deflector 103.

Control of the optical components in the electron optics, such as the lens 102, the scanning deflector 103, and the objective lens 104, is executed by the electron optics control unit 110. Position control of the sample is executed by the stage 106 controlled by the stage control unit 112. The entire control/analysis unit 113 is a control unit that controls the entire SEM observation apparatus, and controls the electron optics control unit 110, the stage control unit 112, the image processing unit 114, and the like by interpreting the input information from the operation unit 115, which includes the display, the keyboard, the mouse, and the like, and the storage device 116, and then outputs the processing results to a display unit 206 included in the operation unit 115 and the storage device 116 as needed.

The process executed by the image processing unit 114 can be implemented by any of hardware or software. When the process is executed by hardware, the process can be implemented by integrating a plurality of computing units for performing the process on a wiring board or a semiconductor chip or within a package. When the process is executed by software, the process can be implemented by mounting a high-speed CPU on the image processing unit 114 and executing a desired computation process using a program.

FIG. 1 shows an example in which the SEM defect observation apparatus 118, a recipe management device 120, and a defect information database 121 are connected via a LAN (Local Area Network) 119 as an example of a defect observation system. Images acquired with the SEM defect observation apparatus 118 are stored in the defect information database 121. Besides, information about defects, for example, the conditions to acquire defect images and the detected defect coordinates are also stored in the defect information database 121. The recipe management device 120 acquires defect information, which is necessary to create a recipe, from the defect information database 121, and performs a computation process including image processing to create a recipe. Parameters used in the computation process, the created recipe, and the like may be stored in a storage device incorporated in the recipe management device, or be stored in the defect information database.

Figure 2:
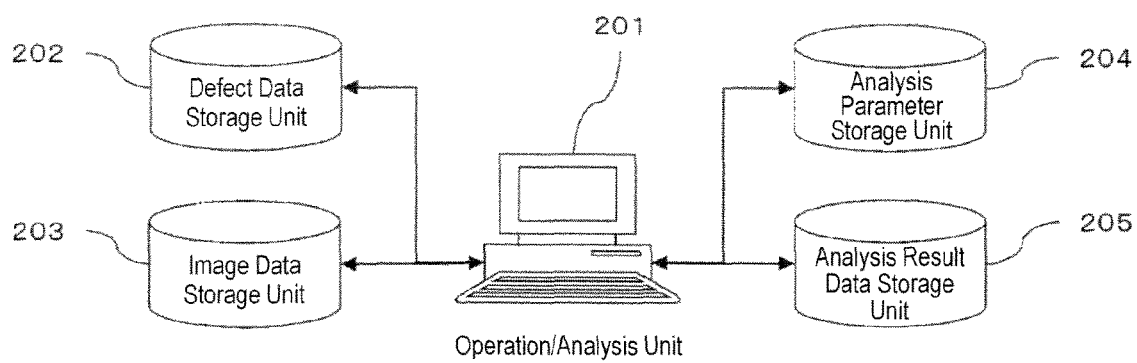
FIG. 2 is a configuration diagram of an operation/analysis unit of a SEM defect observation system.

FIG. 2 is a detailed diagram of the entire control unit and analysis unit 113 in FIG. 1. An operation/analysis unit 201 shown in FIG. 2 represents the entire control/analysis unit 113 and the oration unit 115 in FIG. 1 altogether that are implemented by a plurality of functional blocks implemented by a CPU, which is incorporated in the entire control/analysis unit 113, by executing a predetermined program in response to an operation instruction from the operation unit 115. As described above, the entire control/analysis unit such as the one shown in FIG. 1 is not limited to the configuration incorporated in the SEM observation apparatus, and may be constructed by providing the operation/analysis unit 201 shown in FIG. 2 independently of the SEM observation apparatus shown in FIG. 1 and connecting the components in FIGS. 1 and 2 over a network.

When the entire control/analysis unit is incorporated in the SEM observation apparatus shown in FIG. 1, a defect data storage unit 202, an image data storage unit 203, an analysis parameter storage unit 204, and an analysis result data storage unit 205 may be integrated with the storage device 116 in FIG. 1. The defect data storage unit 201 stores defect information such as defect coordinates. The image data storage unit 202 stores defect images captured with the SEM observation apparatus. The analysis parameter storage unit 204 stores conditions such as the ADR conditions and the ADC conditions executed when an image is acquired or analyzed, and thus can reproduce a plurality of conditions. The processing results are stored in the analysis result data storage unit 205.

As another embodiment, the function of the operation/analysis unit 201 may also be implemented by the recipe management device 120 of the SEM defect observation system shown in FIG. 1. Further, it is also possible to implement the defect data storage unit 202, the image data storage unit 203, the analysis parameter storage unit 204, and the analysis result data storage unit 205 using the defect information database 121 of the SEM defect observation system shown in FIG. 1.

Figure 3:
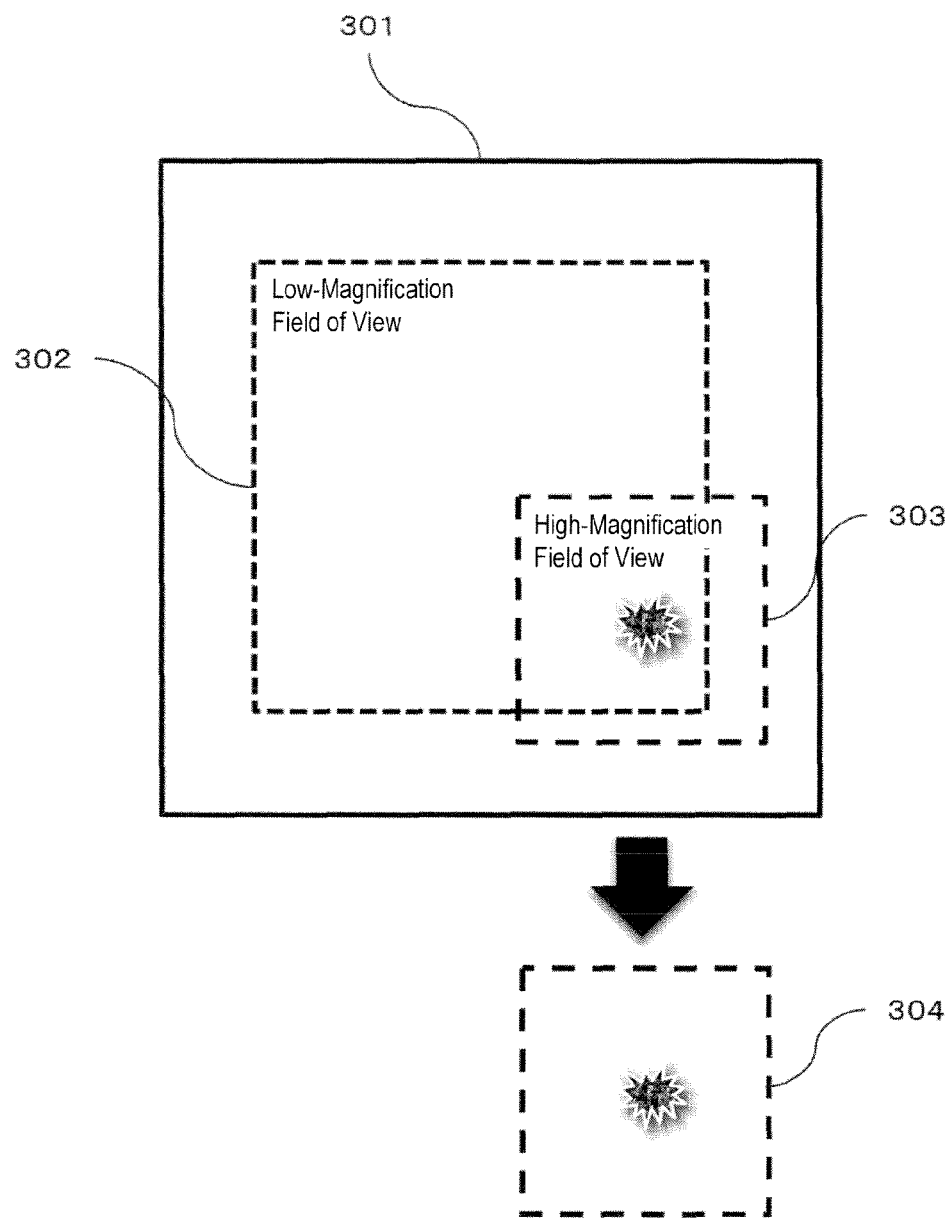
FIG. 3 is a schematic diagram of capturing a high-magnification image when the influence of contamination or local electrification can be ignored.

FIG. 3 is a schematic diagram of an example that adopts the conventional technique and represents a view in which a high-magnification image is acquired the influence of contamination or local electrification generated during acquisition of a low-magnification image can be ignored. First, a region of a low-magnification field of view 302 of a sample 301, which is a target to be observed, is irradiated with a primary electron beam to acquire a low-magnification image. The SEM observation apparatus acquires a low-magnification image by setting the coordinates of a defect position output from a higher-level inspection apparatus or the coordinates of a target position to be observed, which has been determined through simulation, at the center of the field of view.

The case example in FIG. 3 is an example in which a defect detected with a higher-level inspection apparatus is observed. The defect is located at the center of the low-magnification field of view under the ideal conditions in which the defect detection accuracy of the higher-level inspection apparatus is high and the stage accuracy of the SEM observation apparatus is also high. However, in practice, the defect detection accuracy of the higher-level inspection apparatus is on the order of microns. Thus, the magnification of a low-magnification image is often lowered by setting the low-magnification field of view to several microns so that the low-magnification field of view contains a defect.

Next, defect coordinates are detected from the low-magnification image, and then, a high-magnification image 304 is acquired with a desired high-magnification field of view 303 by setting the detected defect coordinates at the center of the high-magnification field of view. ADR is a technique that automates such procedures. Typically, a method is used that detects defect coordinates by comparing a low-magnification defect image in which a defect is located in the field of view with a low-magnification reference image in which a defect is not present in the field of view. The size of the high-magnification field of view 303 is set adequately in accordance with what is to be analyzed with the acquired high-magnification image 304. The size of the high-magnification field of view is input by a user or is automatically set in accordance with what is to be analyzed, and is registered in a recipe that represents the inspection conditions.

Figure 4:
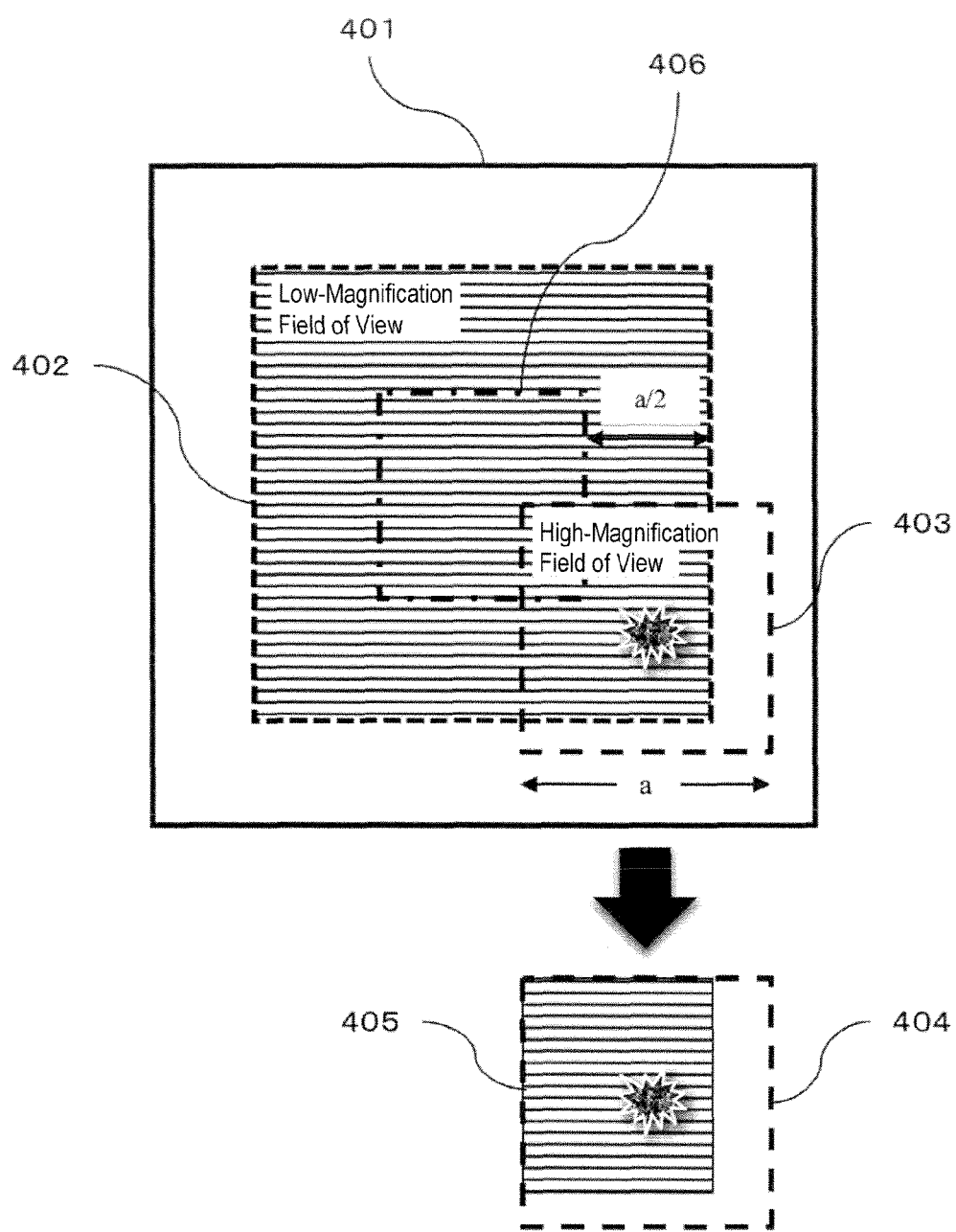
FIG. 4 is a schematic diagram of capturing a high-magnification image when the influence of contamination or local electrification cannot be ignored.

FIG. 4 shows the problem of the conventional technology that occurs if a high-magnification image is acquired under the same conditions as those in FIG. 3 when the influence of contamination or local electrification generated during acquisition of a low-magnification image cannot be ignored. Although the following example illustrates a case where the image quality is changed due to the influence of contamination or local electrification generated upon electron beam irradiation, the cause of the change of the image quality is not limited thereto, and can be other causes. As in FIG. 3, a region of a low-magnification field of view 402 of a sample 401, which is a target to be observed, is irradiated with a primary electron beam to acquire a low-magnification image. Depending on a combination of the observation environments, observation conditions, materials of the sample, and the like, there may be cases where contamination or local electrification is noticeable. In particular, in response to the growing importance of analyzing a minute defect in accordance with the miniaturization of the pattern size as well as the increased complexity of the production process, there have been increasing case examples in which the number of integrations of frames is increased to reduce noise of a low-magnification image and thus acquire a high-quality defect image, and there have thus been more cases where an image is acquired under the conditions that are susceptible to the influence of contamination or local electrification.

As in the case example in FIG. 4, if a high-magnification image 404 is acquired so that a defect is located at the center of a high-magnification field of view 403 under the conditions in which contamination or local electrification of the low-magnification field of view is noticeable, the high-magnification field of view will contain the boundary between a portion that has received influence 405 of the contamination or local electrification and a portion that has not received such influence, that is, the outer edge of the low-magnification image. Thus, there will be a clear difference in the appearance of the two portions. As described above, in the conventional technology, a high-magnification image is acquired so that a defect is located at the center of the high-magnification image. Thus, there may be cases where the high-magnification image contains the boundary of contamination or local electrification generated during acquisition of a low-magnification image. In particular, such a problem occurs when a defect is detected in a region on the inner side than the outer edge of a low-magnification image by half or more the length of a side of the field of view of a high-magnification image (i.e., outside a region of reference numeral 406 and within the outer edge of the low-magnification field of view 402 in FIG. 4) because a part of the high-magnification field of view is not contained in the low-magnification field of view.

Further, when a high-magnification image contains the boundary of contamination or local electrification generated during acquisition of a low-magnification image, not only is there a problem of the appearance but also there may be adverse effect of the presence or absence of the contamination or local electrification on, when the feature quantity of the defect is determined later using the high-magnification image through an ADR, ADC process, or the like, the calculation of the feature quantity, which is problematic. In the ADC, a defect image is analyzed to quantitatively determine the feature of the defect and identify the type of the defect on the basis of the quantitatively determined feature quantity. Thus, it is important to acquire a defect image under the conditions that allow stable determination of the feature quantity of the defect. In the circumstance in which a defect image is influenced by contamination or local electrification, calculation of the feature quantity of the defect can be unstable, and the result of classification can thus be unstable. Thus, it is desired to acquire a defect image without the influence of contamination.

The terms "field of view" and "range of the field of view" as referred to in this specification mean a region that is contained in an output image, while the phrase "size of the field of view" means the size of the region. In addition, the boundary between the inner side and the outer side of the field of view will be referred to as the "outer edge of the field of view," and the phrase "within the field of view" means the inner side of the outer edge of the field of view. Further, the phrase "the center of the field of view" means the center position of the field of view. Although the description will be made on the assumption that the shape of the field of view is a square unless otherwise stated, the present invention is not limited thereto, and the field of view may be a rectangle, for example.

Figure 5:
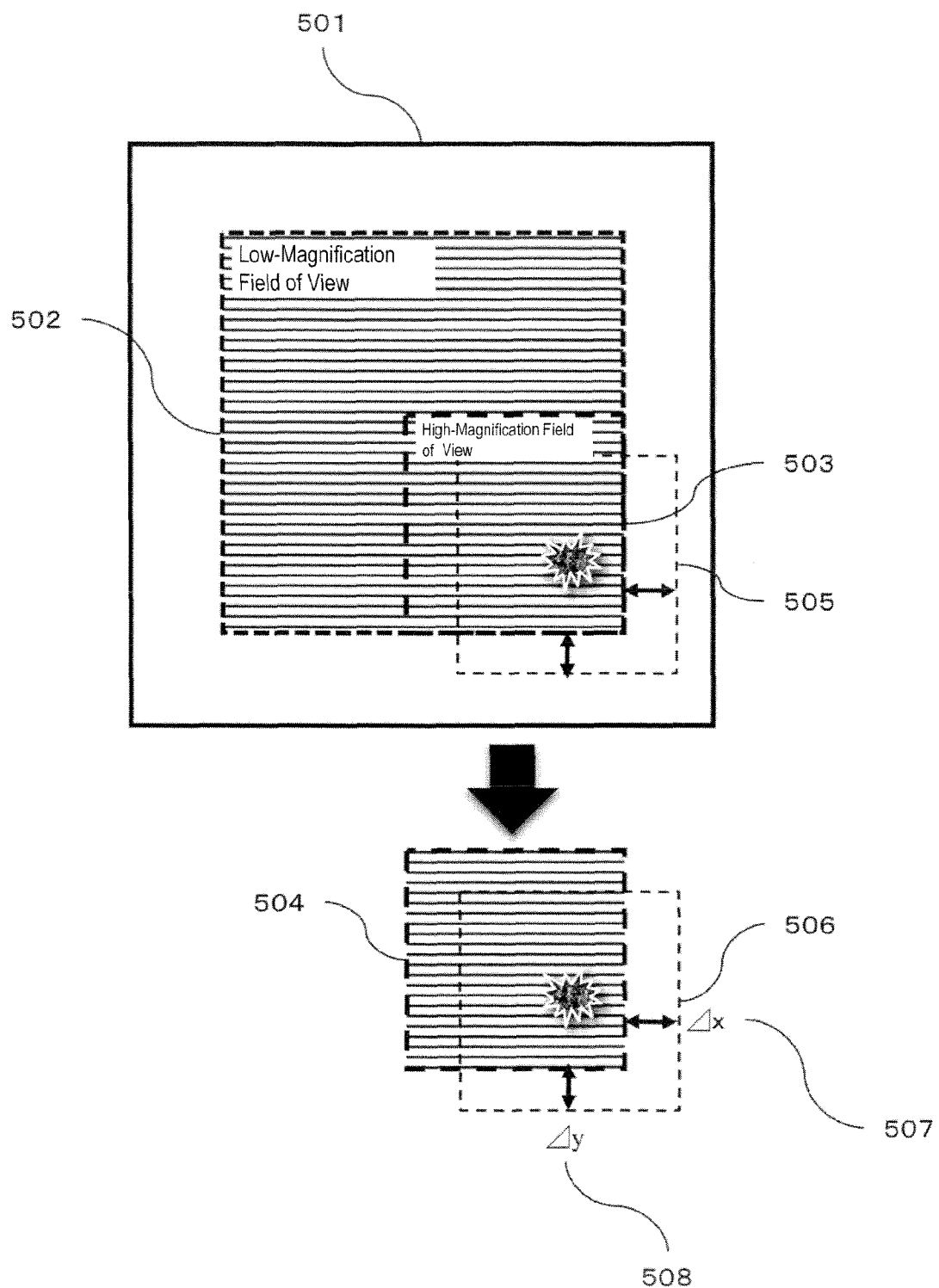
FIG. 5 is a schematic diagram of capturing a high-magnification image by optimizing the center of the high-magnification field of view.

FIG. 5 is a schematic diagram illustrating a method of acquiring a high-magnification image in this embodiment. As in FIGS. 3 and 4, a region of a low-magnification field of view 502 of a sample 501, which is a target to be observed, is irradiated with a primary electron beam to acquire a low-magnification image. After that, the acquired low-magnification image (i.e., image to be inspected) is compared with an image of a region having a pattern corresponding to the pattern of the low-magnification image and having no defects, whereby a defect is detected. A defect may also be detected with other methods, for example, a method of forming a composite image without defects by using the periodicity of the background pattern of the acquired defect image and comparing the composite image with the defect image to detect a defect, a method of comparing reference data generated from the design data with the defect image, and the like. Hereinafter, an image or data that is compared with the image to be inspected in detection of a defect will be collectively referred to as a reference image.

In the conventional technology, a high-magnification image 506 is acquired with the detected defect coordinates set at the center of a high-magnification field of view 505. Thus, as shown in the case example in FIG. 4, the high-magnification image 506 contains the boundary of contamination or local electrification generated during acquisition of a low-magnification image. In contrast, in the case example shown in FIG. 5, the center position of the high-magnification field of view 503 is controlled so that the high-magnification field of view is located within the low-magnification field of view. In other words, the field of view of the high-magnification image is set so that the high-magnification image does not contain the outer edge of the low-magnification image, whereby the high-magnification image is prevented from containing the boundary of contamination or local electrification generated during acquisition of the low-magnification image. Specifically, a high-magnification image is acquired by, provided that the x-direction components and the y-direction components of the deviation amount of the high-magnification field of view 505 with respect to the low-magnification field of view 502 in the conventional method are $\Delta x$ (507) and $\Delta y$ (508), respectively, setting the coordinates of the detected defect coordinates (x,y), which have been moved in the direction of the center of the low-magnification field of view by the deviation amount $(\Delta x, \Delta y)$, at the center of the high-magnification field of view 503.

$\Delta x$ and $\Delta y$ can be calculated from Formulae (1) and (2), where the center of the low-magnification field of view is the origin (0,0), the defect coordinates detected from the low-magnification image are (x,y), the size of the low-magnification field of view is ($FOV_{Low\_x}$, $FOV_{Low\_y}$), and the size of the high-magnification field of view is ($FOV_{High\_x}$, $FOV_{High\_y}$).

$$\Delta x = |x| + \frac{FOV_{High\_x}}{2} - \frac{FOV_{Low\_x}}{2} \quad \text{[Formula 1]}$$

$$\Delta y = |y| + \frac{FOV_{High\_y}}{2} - \frac{FOV_{Low\_y}}{2} \quad \text{[Formula 2]}$$

Δx and Δy respectively represent the distances in the x and y directions between a side of the outer edge of a high-magnification image that is acquired with the position of a defect set at the center (the side is not contained in the range of the field of view of a low-magnification image) and the closet side of the outer edge of the low-magnification image. It should be noted that the field of view of the high-magnification image may also be moved in the direction of the center of the low-magnification field of view by an amount greater than Δx,Δy. However, it is essential that the high-magnification image contain the defect.

Although FIG. 5 shows an example in which neither Δx nor Δy is zero, the aforementioned method is also applicable to a case where one of Δx or Δy is zero.

The above method allows the field of view of the high-magnification image not to contain the outer edge of the low-magnification image. Thus, a high-magnification image 504 that contains no boundary of contamination or local electrification in the field of view of the image is obtained.

Figure 6:
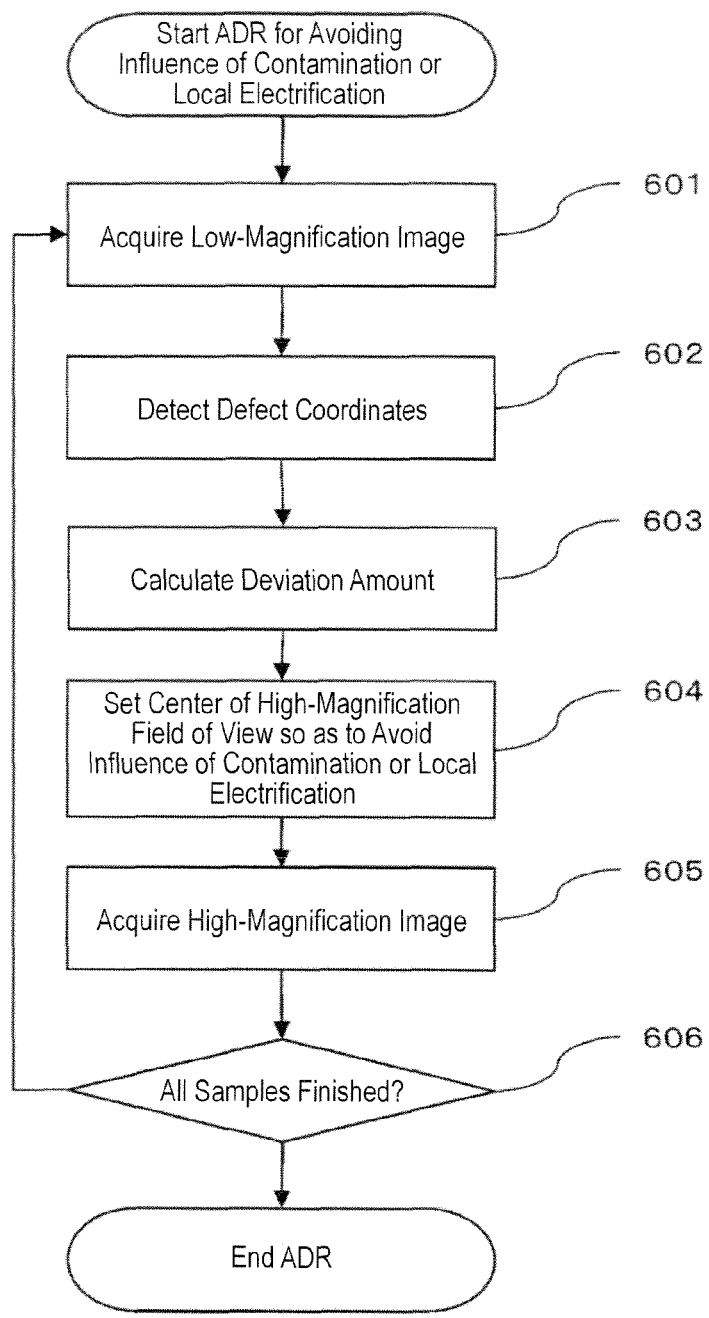
FIG. 6 is an ADR flowchart that optimizes the center of the high-magnification field of view.

FIG. 6 is a flowchart when the method described with reference to FIG. 5 is applied to the ADR. First, a low-magnification image is acquired by using defect coordinates detected with a higher-level inspection apparatus as input information and setting the defect coordinates at the center of the field of view (601). The defect coordinates are detected from the acquired low-magnification image (602). For detection of the defect coordinates, any method can be used as described above.

Next, the deviation amount (Δx,Δy) defined in FIG. 5 is calculated (603), and the center of the high-magnification field of view is moved toward the inner side of the low-magnification field of view by the deviation amount so that the high-magnification image does not contain the boundary of contamination or local electrification generated during acquisition of the low-magnification image, that is, the outer edge of the low-magnification image (604). Then, a high-magnification image is acquired on the basis of the set high-magnification field of view (605). The series of such processes is executed on all target samples to be observed (606).

According to such a method, it is possible to, when automatically acquiring a high-magnification image of a defect with the ADR, prevent the high-magnification image from containing the boundary of contamination or local electrification generated during acquisition of a low-magnification image.

However, when the field of view of the high-magnification image is set as shown in FIGS. 5 and 6, a problem occurs such that the defect is not located at the center of the high-magnification image. When an ADC process or the like is executed using a high-magnification image, for example, there will be no problem even if a defect is not located at the center of the image. However, when an image is analyzed not automatically but by humans, for example, through visual check, there may be cases where the visual impression cannot be ignored.

Figure 7:
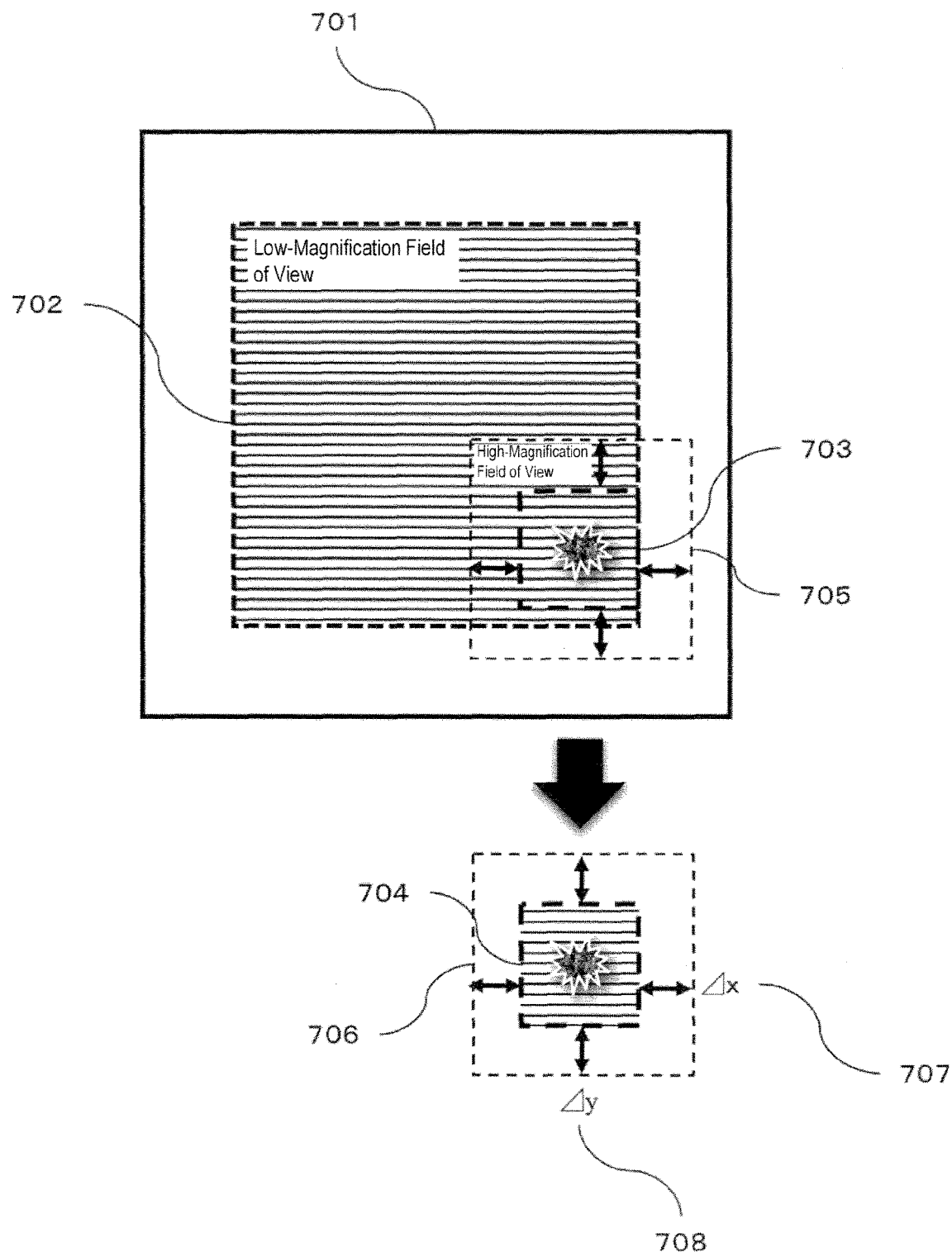
FIG. 7 is a schematic diagram of capturing a high-magnification image by optimizing the size of the high-magnification field of view.

FIG. 7 shows means for solving the problem. FIG. 7 is a schematic view showing a method of acquiring a second high-magnification image in this embodiment. First, a region of a low-magnification field of view 702 of a sample 701, which is a target to be observed, is irradiated with a primary electron beam to acquire a low-magnification image. As in FIG. 5, the x-direction components and the y-direction components of the deviation amount of a high-magnification field of view 705, 706 with respect to the low-magnification field of view 702 in the conventional method are defined as Δx (707) and Δy (708), respectively. Next, the size of the high-magnification field of view is reduced by (2×Δx,2×Δy) as indicated by reference numeral 703 so that the defect is located at the center of the high-magnification image, and thus, a high-magnification image 704 is acquired with the detected defect coordinates set at the center. Herein, the size indicated by the phrase "by the amount of (2×Δx,2×Δy)" refers to a region that is within the field of view of the high-magnification image determined by the size of the field of view of the high-magnification image, which has been designated in advance, and contains the defect located at the center, and is not contained in the field of view of the low-magnification image. In other words, the size refers to a region that is outside the field of view of the low-magnification image when a high-magnification image is captured with a defect set at the center of the field of view of the high-magnification image designated in advance. It should be noted that the field of view of the high-magnification image designated in advance may be input information set by an operator or a field of view set on the basis of the defect size that has been calculated from the low-magnification image so that the occupancy rate of the defect in the high-magnification image becomes greater than or equal to a given rate.

According to such a method, it is possible to prevent a high-magnification image from containing the boundary of contamination or local electrification generated during acquisition of a low-magnification image and further acquire a high-magnification image so that a defect is located at the center of the high-magnification image.

Figure 8:
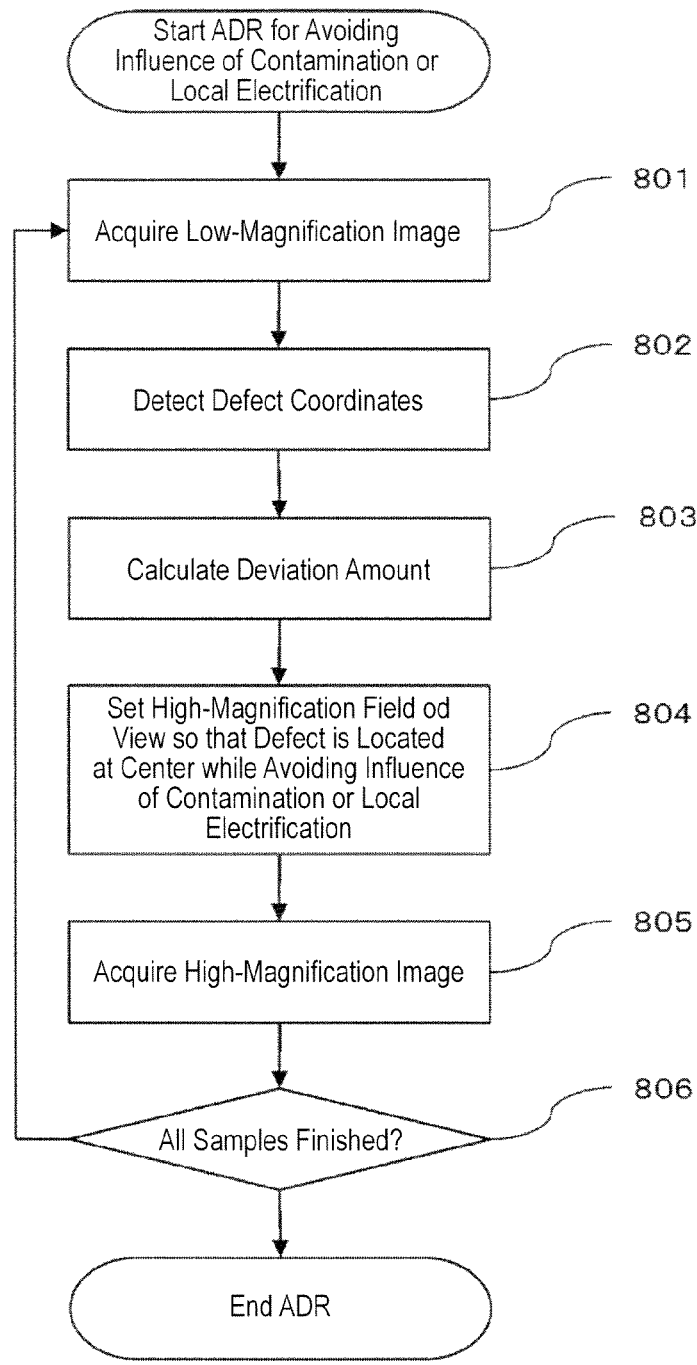
FIG. 8 is an ADR flowchart that optimizes the size of the high-magnification field of view.

FIG. 8 is a flowchart when the method described with reference to FIG. 7 is applied to the ADR. First, a low-magnification image is acquired by using defect coordinates detected with a higher-level inspection apparatus as input information and setting the defect coordinates at the center of the field of view (801). The defect coordinates are detected from the acquired low-magnification image (802). For detection of the defect coordinates, any method can be used as described above.

Next, the deviation amount (Δx,Δy) defined in FIG. 5 is calculated (803), and the high-magnification field of view is set by reducing the size of the field of view double the deviation amount so that the high-magnification field of view does not contain the boundary of contamination or local electrification generated during acquisition of the low-magnification image, that is, the outer edge of the low-magnification image and by setting the detected defect coordinates at the center of the field of view (804). Then, a high-magnification image is acquired on the basis of the set high-magnification field of view (805). The series of such operations is executed on all target samples to be observed (806).

According to such a method, it is possible to, when automatically acquiring a high-magnification image of a defect with the ADR, prevent a high-magnification image from containing the boundary of contamination or local electrification generated during acquisition of a low-magnification image, and further acquire a high-magnification image so that the defect is located at the center of the high-magnification image.

However, when the field of view of the high-magnification image is set as shown in FIGS. 7 and 8, a problem occurs such that the size of the high-magnification image varies. When an ADC process or the like is executed using a high-magnification image, for example, there will be no problem if an application that executes the ADC process supports a variety of image sizes. However, it will be problematic if the application does not support a variety of image sizes. Meanwhile, when an image is visually checked, there is a possibility that a change in the image size may increase the burden on the checker depending on the specifications of an image viewer used for the visual check.

Means for solving such a problem will be described with reference to FIGS. 9, 10, and 11.

Figure 9:
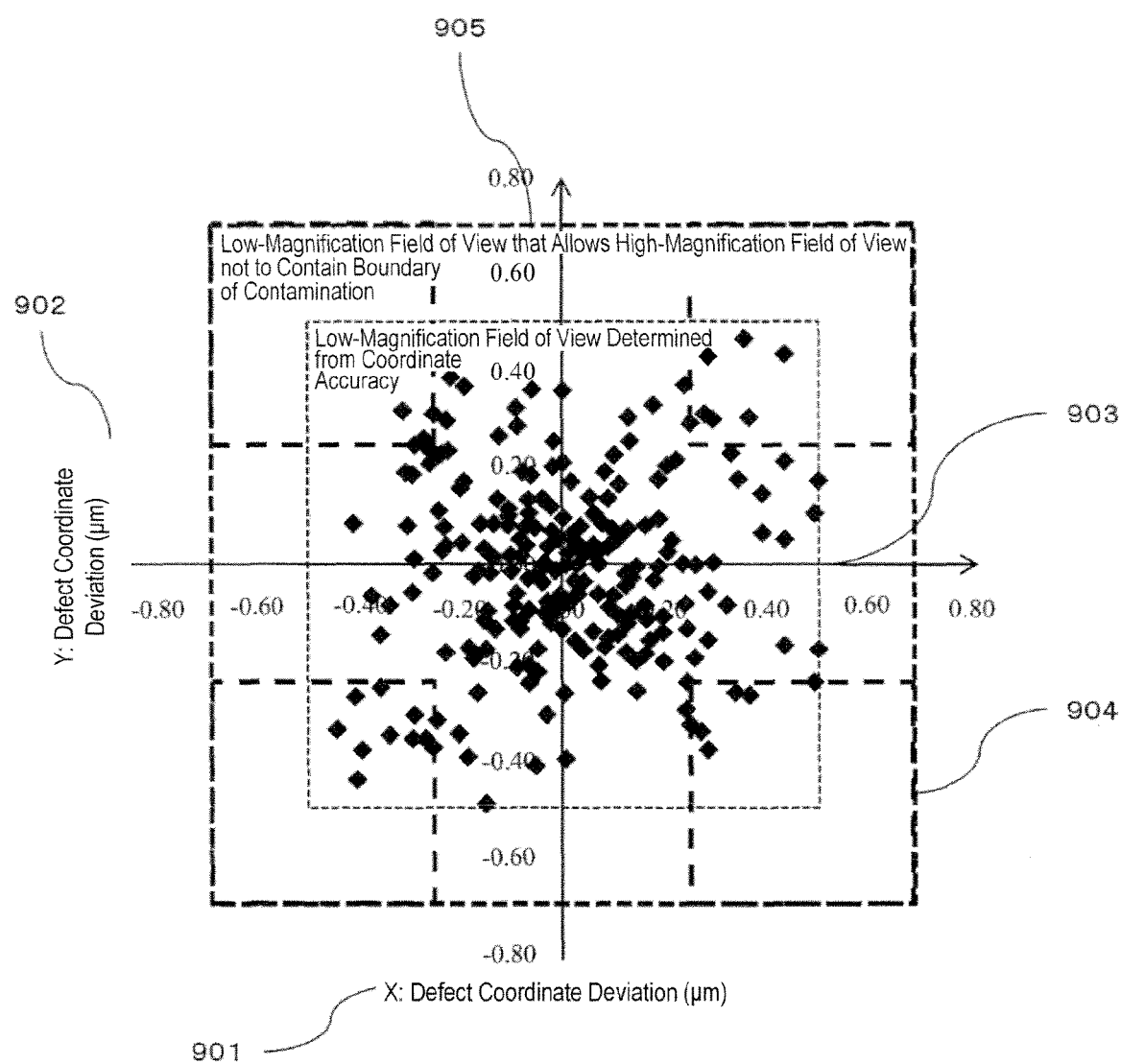
FIG. 9 is a schematic diagram showing the relationship between the low-magnification field of view determined from the defect coordinate accuracy and the high-magnification field of view.

FIG. 9 is a schematic diagram showing the relationship between a low-magnification field of view determined from the defect coordinate accuracy of a higher-level inspection apparatus and a low-magnification field of view determined from the size of the field of view of a high-magnification image. First, the difference between the defect coordinates output from a higher-level inspection apparatus and the defect coordinates re-detected with a SEM observation apparatus is determined, and the difference is plotted with the x-components (901) and the y-components (902) of the defect coordinate deviation placed on the x-axis and the y-axis, respectively. Herein, the defect coordinates output from the higher-level inspection apparatus are at the same coordinates as the center of the field of view of the low-magnification image. Thus, the plot in FIG. 9 can also be regarded as the difference between the center of the field of view of the low-magnification image and the defect coordinates detected with the low-magnification image.

The defect coordinate accuracy of the higher-level inspection device is determined from the deviation amount between the defect coordinates of the higher-level inspection apparatus and the defect coordinates re-detected with the SEM observation apparatus. The size of the low-magnification field of view can be set on the basis of the determined defect coordinate accuracy. Specifically, when the length of one side of the field of view of the low-magnification image is set to a length that is greater than or equal to at least double the maximum value of the deviation amount, the field of view of the low-magnification image can contain defects even if the deviation amount is the maximum. Thus, the low-magnification field of view can be set so that all defects are contained in the low-magnification field of view. However, the method for setting the low-magnification field of view is not limited to such a method. For example, when an inspection apparatus has a large variation of the defect coordinate accuracy or when there is generated a singular point at which an extremely large deviation is generated, it is possible to determine a variance value σ of the deviation amount and set the low-magnification field of view on the basis of the variance value σ.

Next, for a low-magnification field of view 903 set on the basis of the defect coordinate accuracy of the higher-level inspection apparatus, the possible range 905 of the high-magnification field of view for when the detected defect coordinates are set at the center of the high-magnification field of view is determined taking into consideration a desired size of the high-magnification field of view 904 set by the user. Specifically, a range obtained by adding half the size of the high-magnification field of view, which has been set by the user, to the four sides of the low-magnification field of view is the possible range of the high-magnification field of view for when the defect coordinates are set at the center of the high-magnification field of view. In other words, the possible range of the high-magnification field of view for when the defect coordinates are set at the center of the high-magnification field of view can be regarded as the range in which the length, which is obtained by further adding the length of greater than or equal to the length of one side of the field of view of the high-magnification image to the length of one side of the field of view determined on the basis of the coordinate accuracy of the defect inspection apparatus, is one side. Such range is indicated by reference numeral 905.

Although the description has been made using the size of the high-magnification field of view set by the user, the present invention is not limited to such a method, and it is also possible to, when the ADR automatically sets the size of the high-magnification field of view on the basis of the detected defect size, determine the range of the high-magnification field of view using the maximum size of the high-magnification field of view that may be automatically set.

Next, the way to determine the actual range of the field of view of a low-magnification image will be described with reference to FIG. 10. FIG. 10 is a schematic diagram of a method for acquiring a high-magnification image that can prevent the high-magnification image from containing the boundary of contamination or local electrification generated during acquisition of a low-magnification image, and allow a defect to be located at the center of the high-magnification image, and further maintain a desired size of the high-magnification field of view. In FIG. 10, the possible range of the high-magnification field of view for when the defect coordinates are set at the center of the high-magnification field of view is set as the range of the field of view of the low-magnification image that is actually irradiated with a primary electron beam.

First, for a sample 1001, which is a target to be observed, a low-magnification field of view 1005, which has been determined from the possible range of a high-magnification field of view, is set with respect to the size of a low-magnification field of view 1002 determined from the defect coordinate accuracy of a higher-level inspection apparatus, taking into consideration the size of the high-magnification field of view 1003. The low-magnification field of view 1005 determined from the possible range of the high-magnification field of view is irradiated with a primary electron beam to acquire a low-magnification image.

When there is a defect within the low-magnification field of view 1002 determined from the defect coordinate accuracy of the higher-level inspection apparatus, there is no possibility that the high-magnification field of view 1003 may contain the boundary of contamination or local electrification generated during acquisition of the low-magnification image, and it is further possible to acquire a high-magnification image 1004 with a desired size of the high-magnification field of view while the defect is located at the center of the high-magnification image.

However, the low-magnification field of view 1002 determined from the defect coordinate accuracy of the higher-level inspection apparatus is determined from the past records and thus does not ensure the defect coordinate accuracy in the future. Thus, when defect observation is actually executed, there is a possibility that a defect may be located outside the low-magnification field of view 1002 determined from the defect coordinate accuracy. When a defect is located outside the low-magnification field of view 1002 determined from the defect coordinate accuracy, the high-magnification image will contain the boundary of contamination or local electrification generated during acquisition of the low-magnification image even if the method described with reference to FIGS. 9 and 10 is used.

In order to avoid such a problem, using the method described with reference to FIGS. 5 and 6 and the method described with reference to FIGS. 7 and 8 in combination is considered. Specifically, the method described with reference to FIGS. 5 to 8 is used when a defect is detected outside the low-magnification field of view 1002 determined from the defect coordinate accuracy in the method described with reference to FIGS. 9 and 10. Accordingly, in comparison with a case where the method described with reference to FIGS. 5 to 8 is used alone, it is possible to suppress the frequency at which a defect is not located at the center of the high-magnification image as well as the frequency at which the size of the high-magnification field of view varies.

As another method, it is also possible to use a method of limiting the range of a defect detection process such that it occurs only within the low-magnification field of view 1002 determined from the defect coordinate accuracy of the higher-level inspection apparatus. That is, of the actual electron beam irradiation region of the low-magnification field of view that is determined from the possible range of the high-magnification field of view, only a region within the range of the low-magnification field of view determined from the coordinate accuracy of the inspection apparatus is set as a target region of a defect detection process. According to such a method, there is no possibility that the high-magnification image may contain the boundary of contamination or local electrification generated during acquisition of the low-magnification image, and it is further possible to stably acquire the high-magnification image 1004 with a desired size of the high-magnification field of view while the defect is located at the center of the high-magnification image.

An optimum method as to which of the aforementioned methods or which combination of the aforementioned methods should be used may be selected in accordance with the application of the high-magnification image, that is, what analysis is to be performed using the high-magnification image, and in accordance with the specifications of an analysis application.

Figure 10:
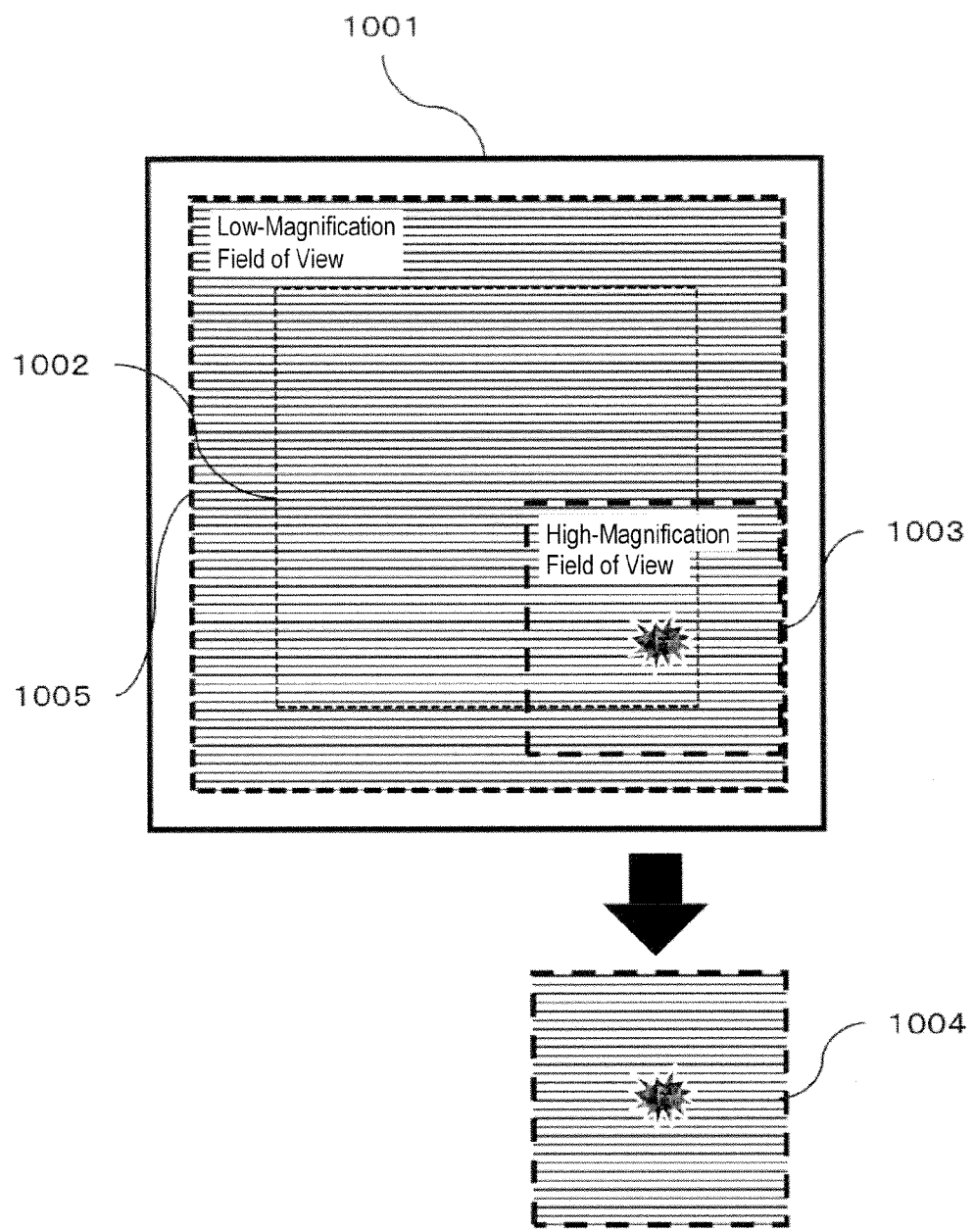
FIG. 10 is a schematic diagram of capturing a high-magnification image by optimizing the size of the low-magnification field of view.
Figure 11:
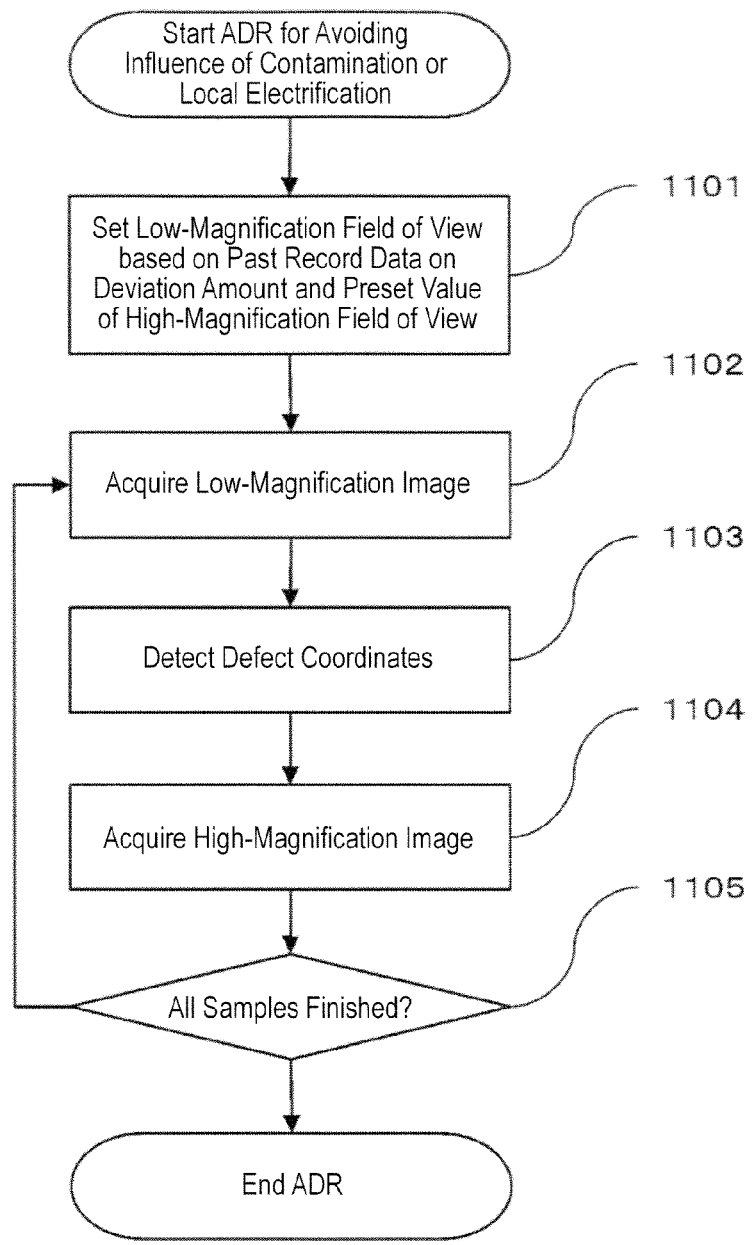
FIG. 11 is an ADR flowchart that optimizes the size of the low-magnification field of view.

FIG. 11 is a flowchart when the method described with reference to FIG. 10 is applied to the ADR. First, for the low-magnification field of view determined from the defect coordinate accuracy of the higher-level inspection apparatus, the possible range of the high-magnification field of view is determined taking into consideration the size of the high-magnification field of view, and the possible range of the high-magnification field of view is set as a low-magnification field of view to be irradiated with a primary electron beam (1101). Then, a low-magnification image is acquired on the basis of the set low-magnification field of view (1102).

Defect coordinates are detected from the acquired low-magnification image (1103). For detection of the defect coordinates, any method can be used as described above. In addition, as described with reference to FIG. 10, the range of defect detection may be limited to within the low-magnification field of view determined from the defect coordinate accuracy of the higher-level inspection apparatus. Next, a high-magnification image is acquired with the detected defect coordinates set at the center of the high-magnification field of view (1104). The series of such processes is executed on all samples (1105).

According to such a method, there is no possibility that the high-magnification image may contain the boundary of contamination or local electrification generated during acquisition of the low-magnification image, and it is further possible to acquire a high-magnification image with a desired size of the high-magnification field of view while the defect is located at the center of the high-magnification image.

Figure 12:
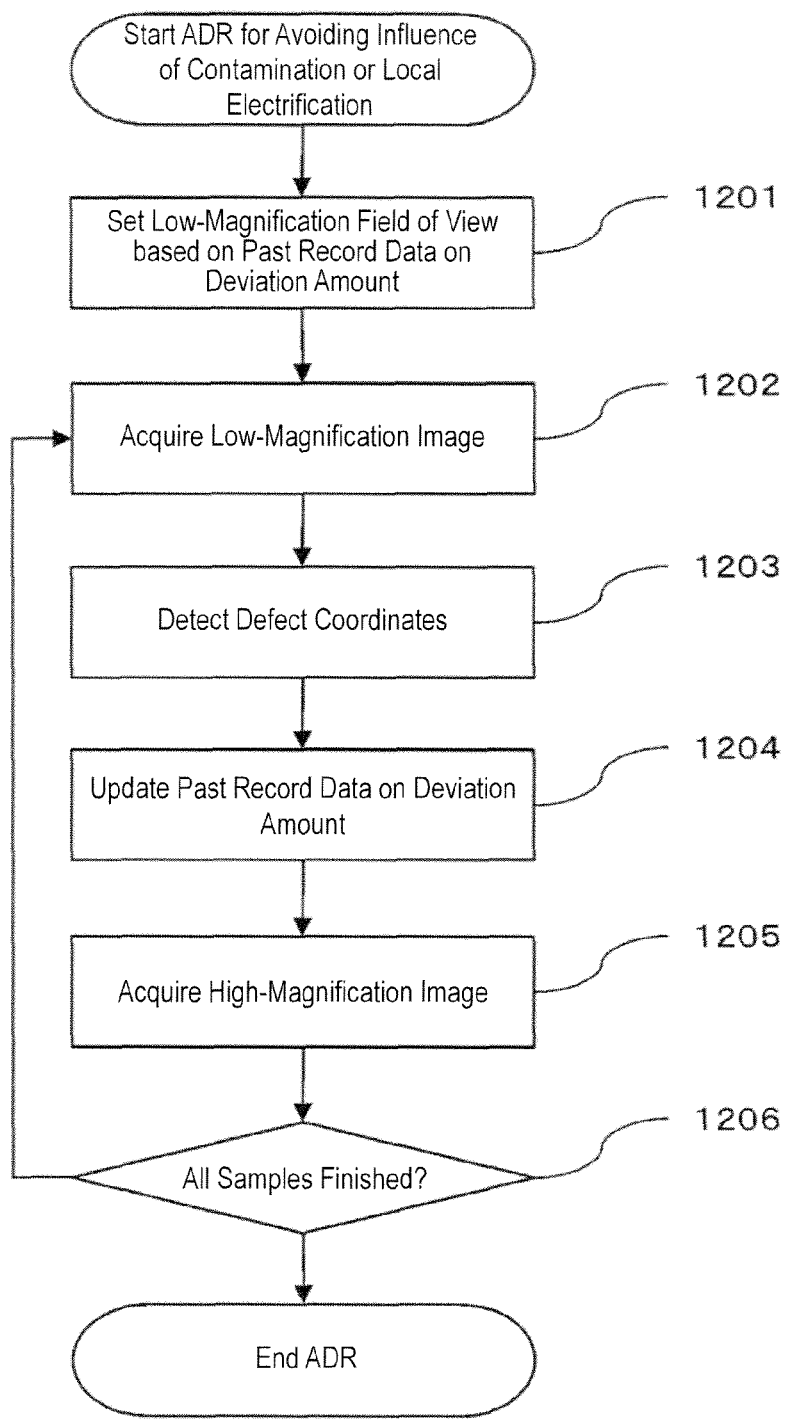
FIG. 12 is an ADR flowchart for updating the size of the low-magnification field of view when reviewed.

FIG. 12 is a flowchart of the ADR for updating the past record data for determining the defect coordinate accuracy of the higher-level inspection apparatus and the size of the low-magnification field of view determined from the past record data when they are reviewed. First, the size of the low-magnification field of view is set on the basis of the past record data on the defect coordinate accuracy of the higher-level inspection apparatus (1201). The size of the low-magnification field of view may also be set taking into consideration the size of the high-magnification field of view as described with reference to FIGS. 10 and 11.

A low-magnification image is acquired on the basis of the set size of the low-magnification field of view (1202). Defect coordinates are detected from the acquired low-magnification image (1203). For detection of the defect coordinates, any method can be used as described above. When the method described with reference to FIGS. 10 and 11 is adopted, it is possible to limit the range of defect detection to within the low-magnification field of view determined from the defect coordinate accuracy of the higher-level inspection apparatus.

The deviation amount of the defect coordinates detected with the higher-level inspection apparatus is determined from the detected defect coordinates, and then, the past record data on the deviation amount is updated by adding the newly determined deviation amount to the past record data on the deviation amount (1204). Next, a high-magnification image is acquired with the detected defect coordinates set at the center of the high-magnification field of view (1205). The series of such process is executed on all target samples to be observed (1206).

According to such a method, even when the state of the aforementioned inspection apparatus has changed and the defect coordinate accuracy has thus varied, or even when the state of the SEM observation apparatus has changed and the stage accuracy has thus varied, it is possible to set the low-magnification field of view such that it follows the variation. Thus, the burden on the user for performing maintenance of the recipe can be reduced.

Figure 13:
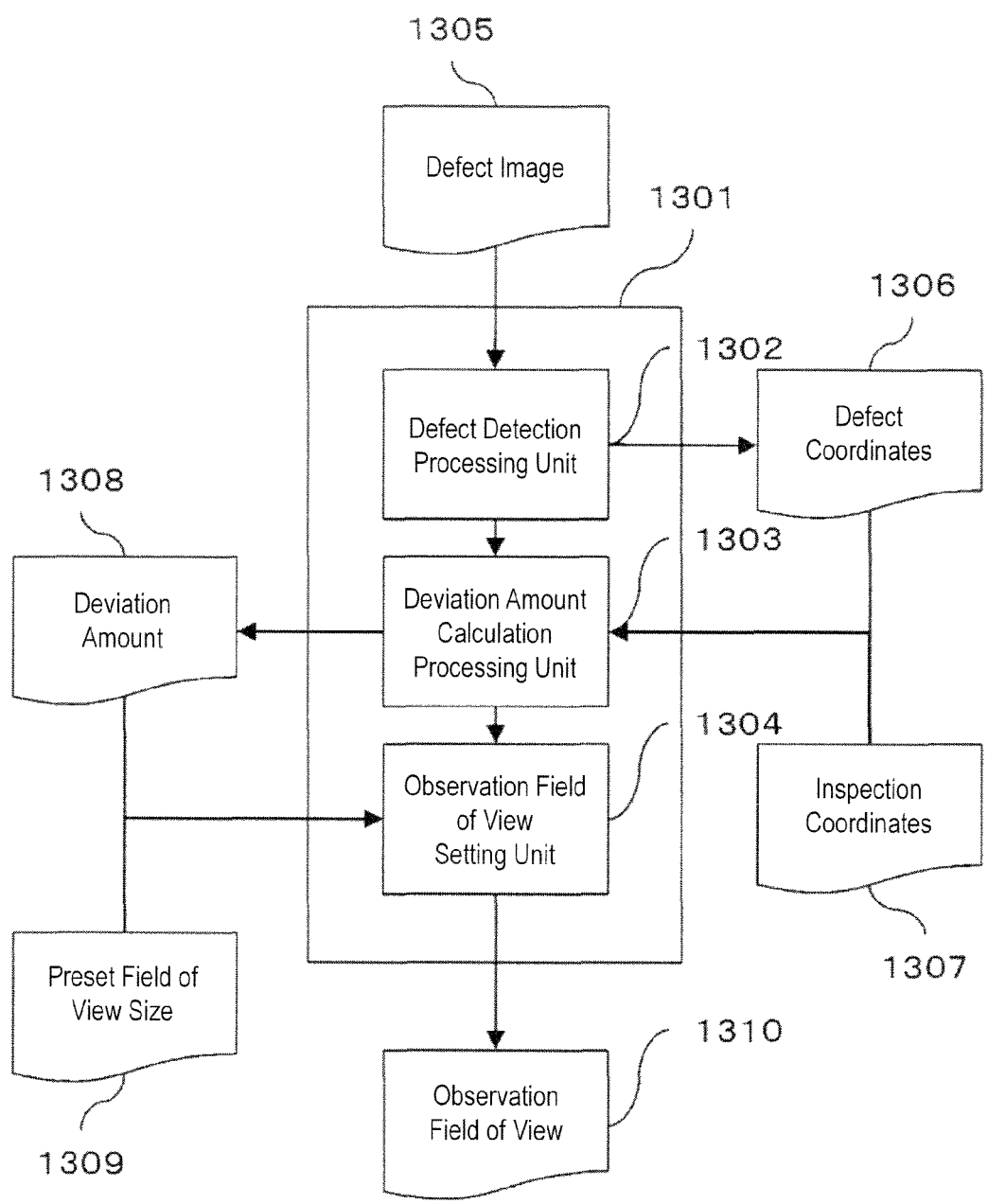
FIG. 13 is a functional block diagram for setting the observation field of view.

FIG. 13 is a functional block diagram of a process of setting the observation field of view in the aforementioned embodiment. An observation field of view setting process block 1301 includes a defect detection processing unit 1302, a deviation amount calculation processing unit 1303, and an observation field of view setting unit 1304. The observation field of view process block 1301 can be mounted on the entire control unit and analysis unit 113 or the recipe management device 120 in FIG. 1, the operation/analysis unit 201 in FIG. 2, or the like.

The defect detection processing unit 1302 calculates defect coordinates 1306 upon receipt of a defect image 1302. Next, the deviation amount calculation processing unit 1303, upon receipt of the defect coordinates 1306 and inspection coordinates 1307, outputs the difference between the coordinates as a deviation amount 1308. Further, the observation field of view setting unit 1304, upon receipt of the deviation amount 1308 and, if any, the preset field of view size 1309, calculates and sets an observation field of view 1309 of the high-magnification image.

As described above, according to the present invention, it is possible to prevent a high-magnification image from containing both a portion in which contamination or local electrification that is generated upon acquisition of a low-magnification image and a portion in which such contamination or local electrification is not generated, and thus provide a defect observation system that can perform a process of detecting defects and classifying the defects with high accuracy.

It should be noted that the present invention is not limited to the aforementioned embodiments, and includes a variety of variations. For example, although the aforementioned embodiments have been described in detail to clearly illustrate the present invention, the present invention need not include all of the structures described in the embodiments. It is possible to replace a part of a structure of an embodiment with a structure of another embodiment. In addition, it is also possible to add, to a structure of an embodiment, a structure of another embodiment. Further, it is also possible to, for a part of a structure of each embodiment, add/remove/substitute a structure of another embodiment. Some or all of the aforementioned structures, functions, processing units, processing means, and the like may be implemented by hardware by designing integrated circuits, for example. Alternatively, each of the aforementioned structures, functions, and the like may be implemented by software by analyzing and executing a program, which implements each function, with a processor.

Information such as the program that implements each function, tables, and files can be stored in a recording device such as memory, a hard disk, or a SSD (Solid State Drive); or a recording medium such as an IC card, an SD card, or a DVD.

In addition, the control lines and information lines represent those that are considered to be necessary for the description, and do not necessarily represent all control lines and information lines that are necessary for a product. Thus, in practice, almost all structures may be considered to be mutually connected.

REFERENCE SIGNS LIST

101 Electron gun
102 Lens
103 Scanning deflector
104 Objective lens
105 Sample
106 Stage
107 Primary electron beam
108 Secondary particles
109 Secondary particle detector
110 Electron optics control unit
111 A/D converter unit
112 Stage control unit
113 Entire control/analysis unit
114 Image processing unit
115 Operation unit
116 Storage device
117 Optical microscope
118 SEM defect observation apparatus
119 LAN
120 Recipe management device
121 Defect information database
201 Operation/analysis unit
202 Defect data storage unit
203 Image data storage unit
204 Analysis parameter storage unit
205 Analysis result storage unit
301 Sample
302 Low-magnification field of view
303 High-magnification field of view
304 High-magnification image
401 Sample
402 Low-magnification field of view
403 High-magnification field of view
404 High-magnification image
405 Influence of contamination or local electrification
501 Sample
502 Low-magnification field of view
503 High-magnification field of view
504 High-magnification image
505 High-magnification field of view
506 High-magnification image
507 X-direction components of deviation amount
508 Y-direction components of deviation amount
701 Sample
702 Low-magnification field of view
703 High-magnification field of view
704 High-magnification image
705 High-magnification field of view
706 High-magnification field of view
707 X-direction components of deviation amount
708 Y-direction components of deviation amount
901 X-components of defect coordinate deviation
902 Y-components of defect coordinate deviation
903 Low-magnification field of view set on the basis of defect coordinate accuracy
904 Size of high-magnification field of view
905 Possible range of high-magnification field of view
1001 Sample
1002 Size of low-magnification field of view determined from defect coordinate accuracy
1003 High-magnification field of view
1004 High-magnification image
1005 Low-magnification field of view determined from possible range of high-magnification field of view
1301 Observation field of view setting process block
1302 Defect detection processing unit
1303 Deviation amount calculation processing unit
1304 Observation field of view setting unit
1305 Defect image
1306 Defect coordinates
1307 Inspection coordinates
1308 Deviation amount
1309 Preset field of view size
1310 Observation field of view

The invention claimed is:

1. A defect observation system for acquiring images of a sample at a first magnification and a second magnification higher than the first magnification, the system comprising:
electron optics including an electron source, a scanning deflector configured to scan the sample by deflecting a primary electron beam generated from the electron source, an objective lens configured to converge the primary electron beam, and a detector configured to detect secondary particles generated from the sample upon irradiation of the sample with the primary electron beam;
one or more processors, configured to:
detect a defect by comparing an image of the sample with the first magnification generated on the basis of a signal from the detector with a predetermined image of a region corresponding to the image of the sample with the first magnification or with reference data,
control the electron optics,
(i) detect a defect coordinate from the image acquired at the first magnification,
(ii) when an outer edge of a first field of view of the image acquired at the first magnification is contained within a second field of view of the second magnification when the second magnification is set to contain the defect coordinate, and move the second field of view of the second magnification so that the defect coordinate is contained within the first field of view of the second magnification and the outer edge of the first field of view of the first magnification goes out of the second field of view of the second magnification, or change the second field of view to a third field of view so that the outer edge of the first field of view of the first magnification is out of the third field of view, wherein the third field of view is smaller than the second field of view.

2. The defect observation system according to claim 1, wherein a position of the field of view of the image acquired at the second magnification is moved toward the inner side of the image acquired at the first magnification by a length that is greater than or equal to a distance from one side of the outer edge of the image with the second magnification acquired with the defect located at a center of the image to the closest side of the outer edge of the image acquired at the first magnification, the one side being not contained in the range of the field of view of the image acquired at the first magnification.

3. The defect observation system according to claim 1, wherein
a size of the field of view of the image acquired at the second magnification is designated in advance, or is set on the basis of a defect size detected from the image acquired at the first magnification, and
the size of the field of view of the image acquired at the second magnification defined by the designated size is reduced by at least a size of a region that is contained in the field of view having the designated or set size and having the defect located at a center of the field of view, and is not contained in the field of view of the image acquired at the first magnification.

4. A defect observation system for acquiring images of a sample containing a defect candidate, which has been detected with a defect inspection apparatus, at a first magnification and a second magnification higher than the first magnification, the system comprising:
electron optics including an electron source, a scanning deflector configured to scan the sample by deflecting a primary electron beam generated from the electron source, an objective lens configured to converge the primary electron beam, and a detector configured to detect secondary particles generated from the sample upon irradiation of the sample with the primary electron beam;
one or more processors, configured to:
detect a defect by comparing an image of the sample with the first magnification generated on the basis of a signal from the detector with a predetermined image of a region corresponding to the image of the sample with the first magnification or with reference data,
control the electron optics,
detect a defect coordinate from the image acquired at the first magnification, and
change a first field of view of the first magnification to a third field of view that is larger than the first field of view so that the outer edge of the third field of view of the third magnification is out of a second field of view of the second magnification, when the outer edge of the first field of view of the first magnification is contained within the second field of view of the second magnification when the second magnification is set to contain the defect coordinate.

5. The defect observation system according to claim 4, wherein a target range in which the defect is to be detected is restricted to within the range of the size of the field of view determined on the basis of the coordinate accuracy of the defect inspection apparatus.

6. The defect observation system according to claim 4, wherein the coordinate accuracy of the defect inspection apparatus is determined on the basis of a position deviation amount between a center of the field of view of the image acquired at the first magnification and a position of the defect detected from the image acquired at the first magnification.

7. The defect observation system according to claim 6, wherein, if a new defect is detected, the coordinate accuracy of the defect inspection apparatus is updated using the position deviation amount between a position of the defect and the center of the field of view of the image with the first magnification used for detection of the defect.

8. A defect observation method for acquiring images of a sample at a first magnification and a second magnification higher than the first magnification, the method comprising:
scanning the sample by deflecting, with a scanning deflector, a primary electron beam generated from an electron source;
detecting, with a detector, secondary particles generated from the sample upon irradiation of the sample with the primary electron beam;
detecting, with an image processing unit, a defect by comparing an image of the sample with the first magnification generated on the basis of a signal from the detector with a predetermined image of a region corresponding to the image of the sample with the first magnification or with reference data; and
detecting, with a controller, a defect coordinate from the image acquired at the first magnification; and
when an outer edge of a field of view of the first magnification is contained within a field of view of the second magnification when the second magnification is set to contain the defect coordinate,
moving, with a controller, the field of view of the second magnification so that the defect coordinate is contained within the field of view of the second magnification and the outer edge of the field of view of the first magnification goes out of the field of view of the second magnification, or
changing, with a controller, the second field of view to a third field of view so that the outer edge of the first field of view of the first magnification is out of the third field of view, wherein the third field of view is smaller than the second field of view.

9. A defect observation method for acquiring images of a sample containing a defect candidate, which has been detected with a defect inspection apparatus, at a first magnification and a second magnification higher than the first magnification, the method comprising:
scanning the sample by deflecting, with a scanning deflector, a primary electron beam generated from an electron source;
detecting, with a detector, secondary particles generated from the sample upon irradiation of the sample with the primary electron beam;
detecting, with an image processing unit, a defect by comparing an image of the sample with the first magnification generated on the basis of a signal from the detector with a predetermined image of a region corresponding to the image of the sample with the first magnification or with reference data;

detecting, with a controller, a defect coordinate from the image acquired at the first magnification; and changing, with a controller, a first field of view of the first magnification to a third field of view that is larger than the first field of view so that the outer edge of the third field of view is out of a second field of view of the second magnification, when the outer edge of the first field of view of the first magnification is contained within the second field of view of the second magnification when the second magnification is set to contain the defect coordinate.

* * * * *

UNITED STATES PATENT AND TRADEMARK OFFICE
CERTIFICATE OF CORRECTION

PATENT NO.        : 9,842,723 B2
APPLICATION NO.   : 14/423091
DATED             : December 12, 2017
INVENTOR(S)       : Takehiro Hirai et al.

It is certified that error appears in the above-identified patent and that said Letters Patent is hereby corrected as shown below:

On the Title Page

Item (57) Abstract:
"When contamination or local electrification is generated during acquisition of a low-magnification image, if a high-magnification image contains both a portion in which the contamination or local electrification is generated and a portion in which the contamination or local electrification is not generated, a region whose image quality has changed due to the contamination or local electrification is erroneously recognized as a defect. Thus, defect detection fails or it may be impossible to correctly determine the feature quantity of a defect. The invention provides a defect observation system that acquires sample images at a low magnification and a high magnification, and sets the position or size of the field of view of the high-magnification image or the electron beam irradiation range during acquisition of the low-magnification image no that the image acquired at the high magnification does not contain the outer edge of the image acquired at the low magnification."

Should read:
-- When contamination or local electrification is generated during acquisition of a low-magnification image, if a high-magnification image contains both a portion in which the contamination or local electrification is generated and a portion in which the contamination or local electrification is not generated, a region whose image quality has changed due to the contamination or local electrification is erroneously recognized as a defect. Thus, defect detection fails or it may be impossible to correctly determine the feature quantity of a defect. The invention provides a defect observation system that acquires sample images at a low magnification and a high magnification, and sets the position or size of the field of view of the high-magnification image or the electron beam irradiation range during acquisition of the low-magnification image so that the image acquired at the high magnification does not contain the outer edge of the image acquired at the low magnification. --.

Signed and Sealed this
Seventh Day of August, 2018

Andrei Iancu
*Director of the United States Patent and Trademark Office*